United States Patent [19]
Gal et al.

[11] Patent Number: 5,471,345
[45] Date of Patent: Nov. 28, 1995

[54] WAVEFRONT CORRECTOR FOR SCANNING MICROLENS ARRAYS

[75] Inventors: George Gal, Palo Alto; William W. Anderson, Half Moon Bay; Bruce J. Herman, Mountain View; Dean M. Shough, Newark, all of Calif.

[73] Assignee: Lockheed Missiles & Space Company, Inc., Sunnyvale, Calif.

[21] Appl. No.: 271,638

[22] Filed: Jul. 7, 1994

Related U.S. Application Data

[60] Division of Ser. No. 64,947, May 20, 1993, Pat. No. 5,444,572, which is a continuation-in-part of Ser. No. 11,323, Jan. 29, 1993, which is a continuation-in-part of Ser. No. 982,514, Nov. 27, 1992, Pat. No. 5,310,623.

[51] Int. Cl.$^6$ .................................................. G02B 27/09
[52] U.S. Cl. ..................... 359/619; 359/620; 359/622; 359/741; 359/742
[58] Field of Search ................................. 359/619, 620, 359/621, 622, 639, 637, 566, 569, 573, 574, 575, 741, 762

[56] References Cited

U.S. PATENT DOCUMENTS

| | | | |
|---|---|---|---|
| 3,932,184 | 1/1976 | Cohen et al. | 96/38.3 |
| 4,200,794 | 4/1980 | Newberry et al. | 250/396 ML |
| 4,279,690 | 7/1981 | Dierschke | 156/649 |
| 4,421,398 | 12/1983 | Suzuki et al. | 354/200 |
| 4,427,265 | 1/1984 | Suzuki et al. | 350/321 |
| 4,691,993 | 9/1987 | Porter et al. | 350/105 |
| 4,775,967 | 10/1988 | Shimada et al. | 369/45 |
| 4,861,140 | 8/1989 | Lucitte et al. | 350/320 |
| 4,877,717 | 10/1989 | Suzuki et al. | 430/321 |
| 4,983,040 | 1/1991 | Chu et al. | 356/338 |
| 4,986,633 | 1/1991 | Ohta | 350/167 |
| 5,136,164 | 8/1992 | Hendrick, Jr. | 250/353 |
| 5,139,602 | 8/1992 | Fields et al. | 359/619 X |
| 5,139,609 | 8/1992 | Fields, et al. | 156/643 |
| 5,151,790 | 9/1992 | Takatori et al. | 359/619 X |
| 5,191,472 | 3/1993 | Kurematsu et al. | 359/619 |
| 5,310,623 | 5/1994 | Gaul | 430/321 |
| 5,319,496 | 6/1994 | Jewell et al. | 359/619 X |

OTHER PUBLICATIONS

G. Artzner "Aspherical surfaces engraved on photoresist coatings: manufacture of a zonal corrector plate for an aberrating casegrainian telescope", 1987, *Optical Components and Systems*, SPIE vol. 805.

E. Hausmann & E. P. Slack, Physics, (3rd Edition, 1948) at 727–728.

*Primary Examiner*—Do H. Yoo
*Attorney, Agent, or Firm*—Feix & Feix; H. Donald Volk

[57] ABSTRACT

Wavefront correction apparatus for correcting a stepped wavefront output produced by certain angles of scan and by certain positions of scan in scanning microlens arrays includes anamorphic transfer optics with diffractive corrections. The transfer optics form the outputs of all of the unit cell trains of the microlens arrays into a unique, separate, linear image at each position of scan of the scanning array. A stepped wavefront corrector is positioned in the path of each linear image, and selected thicknesses of the material in the stepped wavefront corrector are effective to vary the times of optical passage through the stepped wavefront corrector in amounts to restore the wavefront to a continuous, unstepped form at the outlet of the plate.

2 Claims, 13 Drawing Sheets

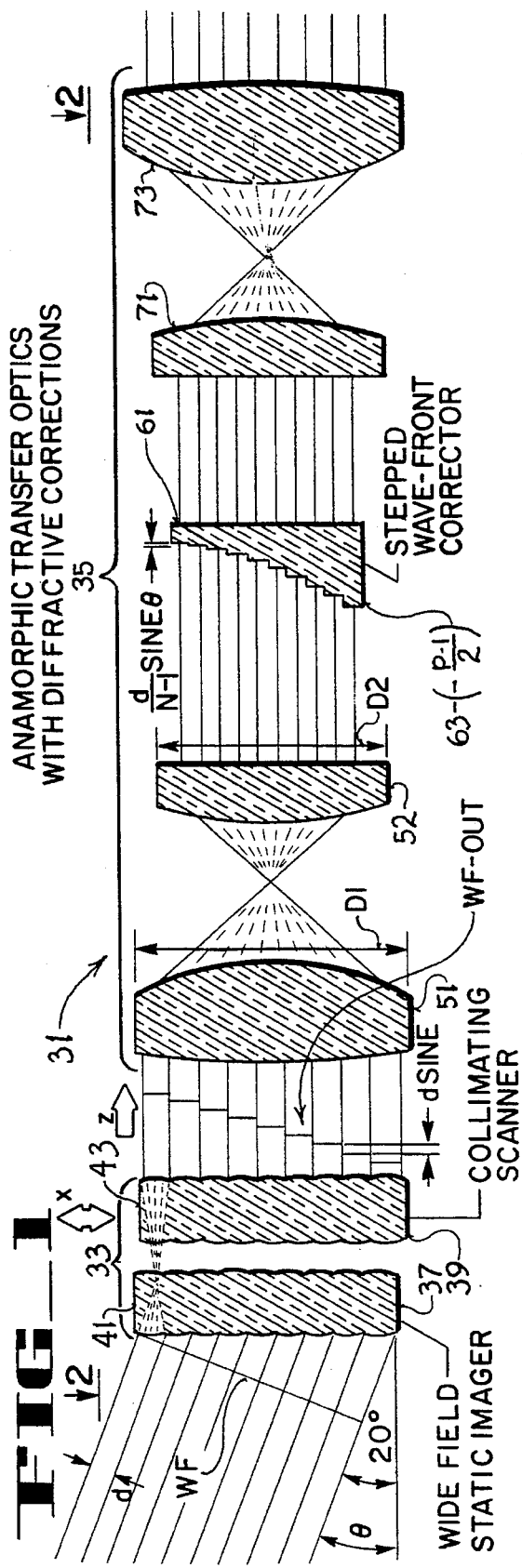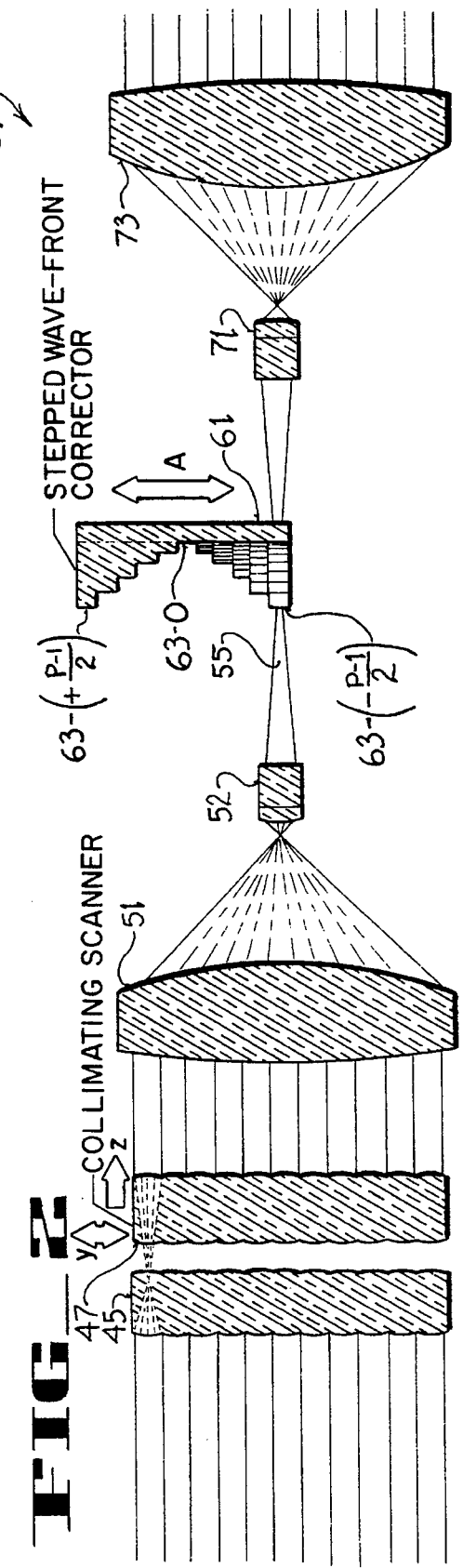

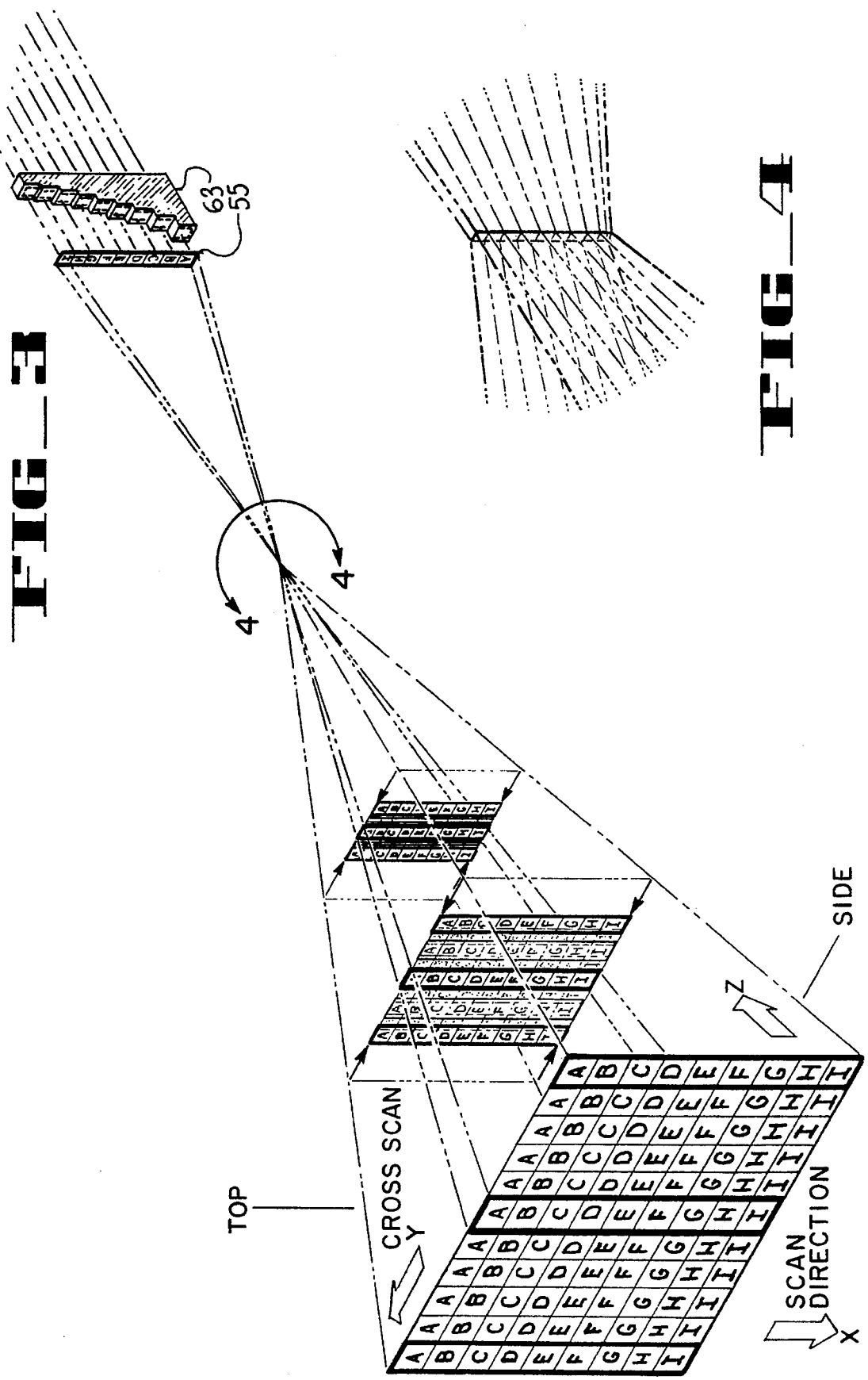

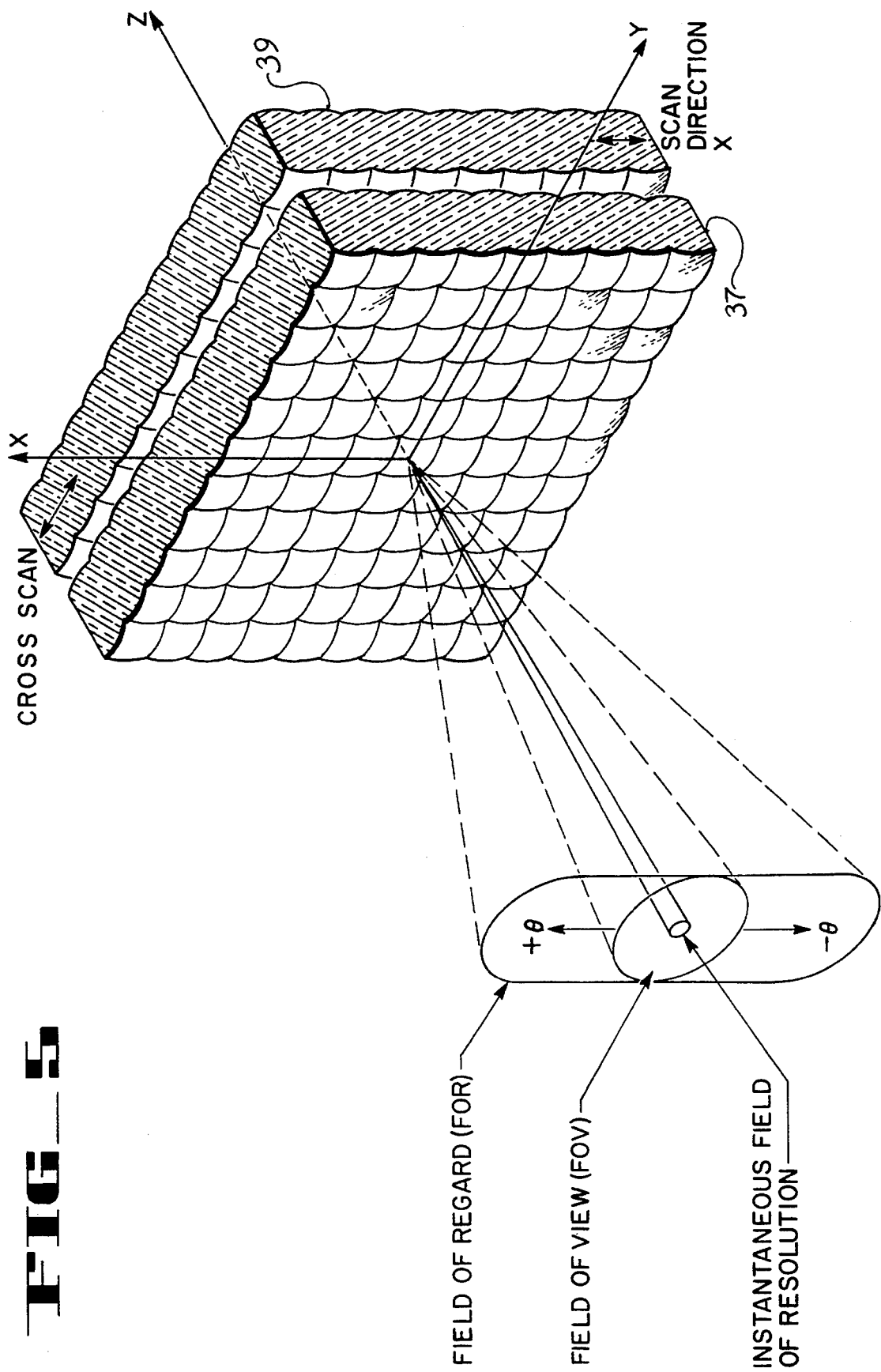
FIG_5

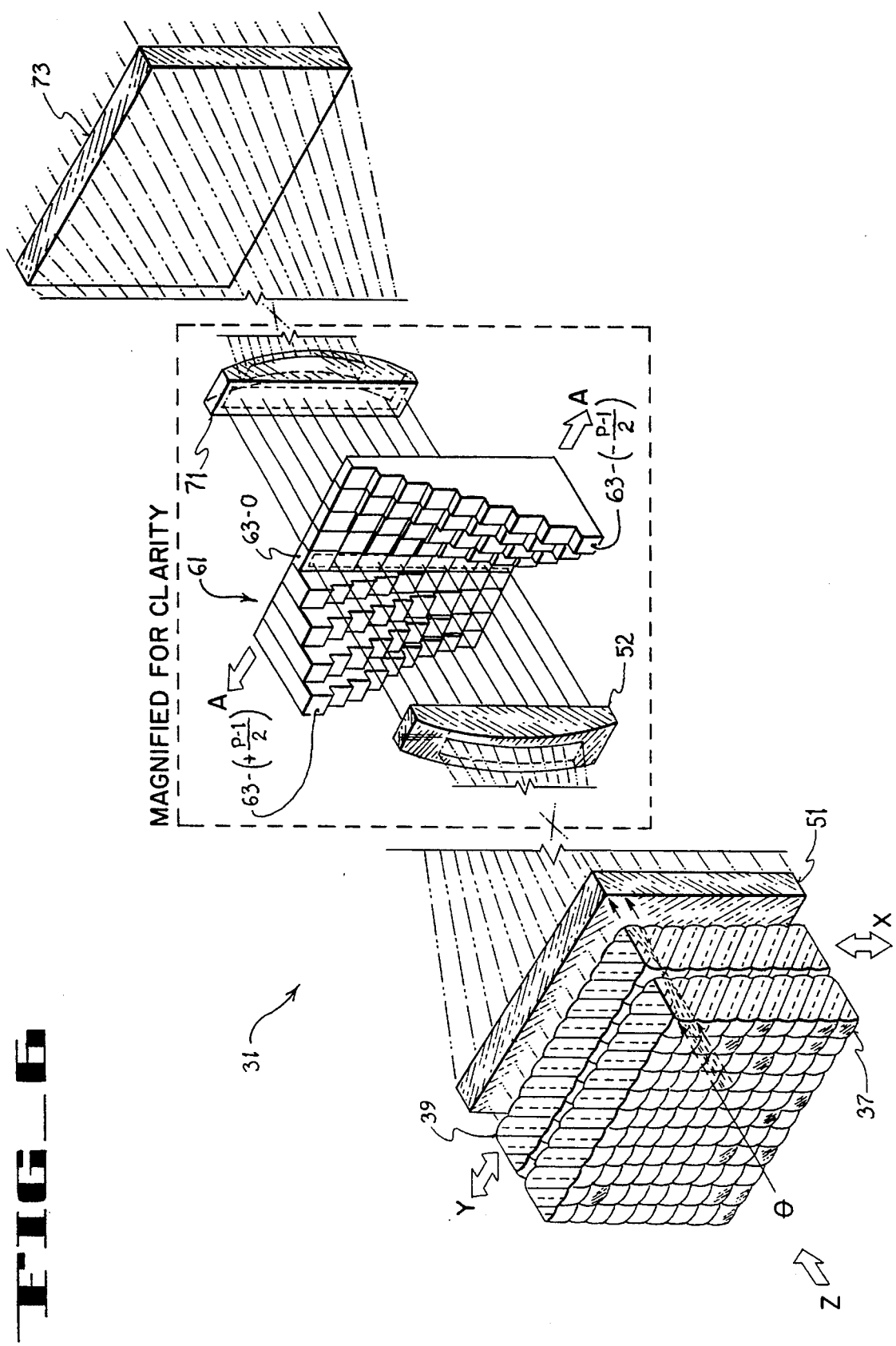

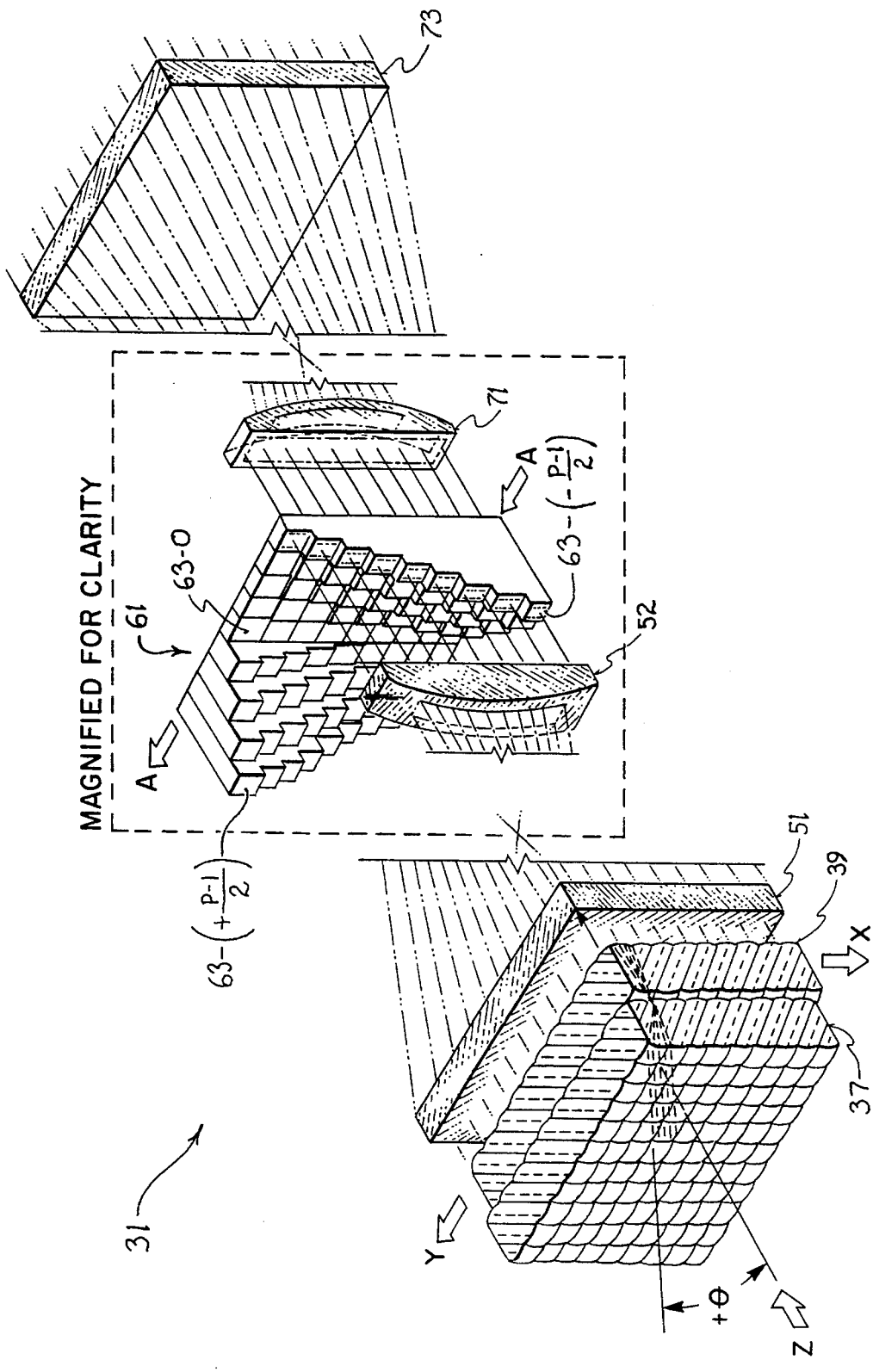

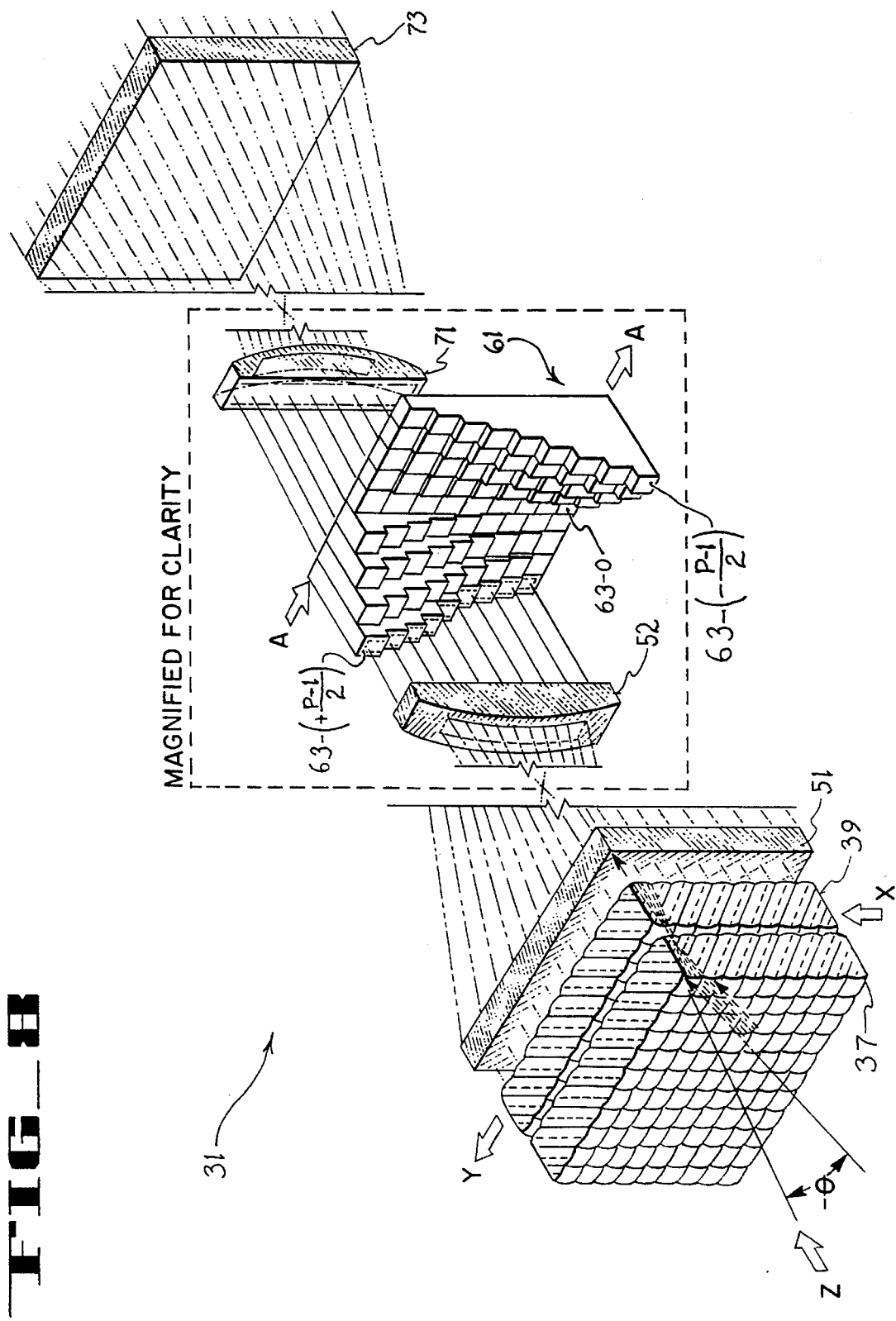

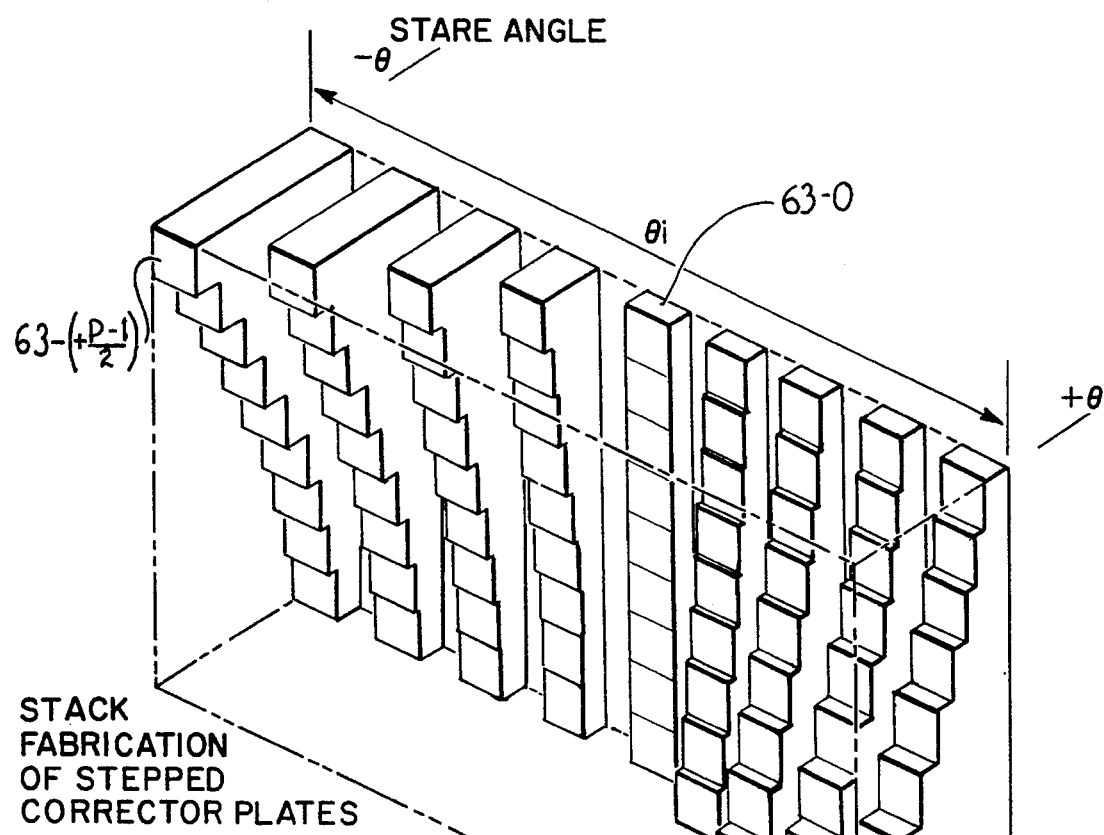
FIG_9
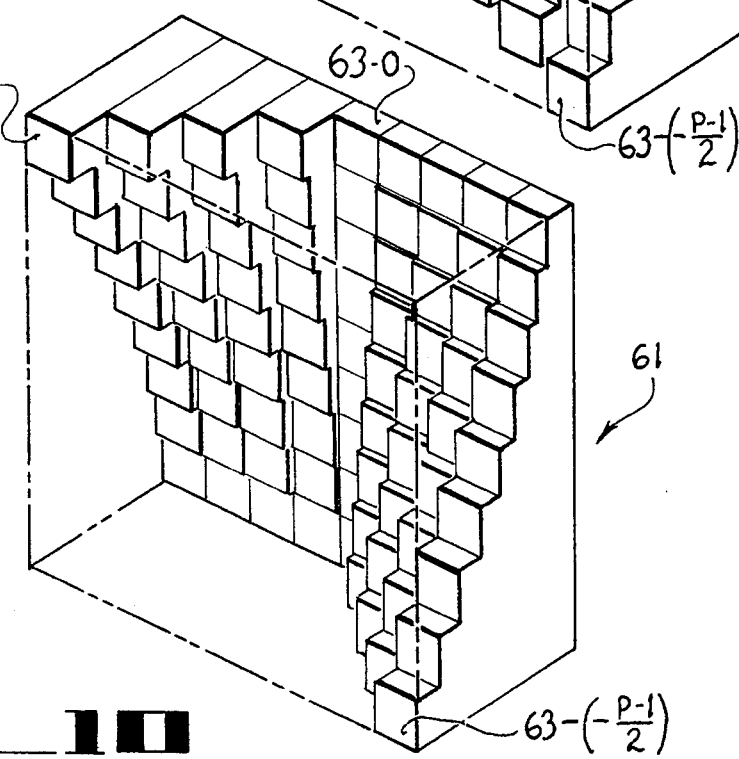
FIG_10

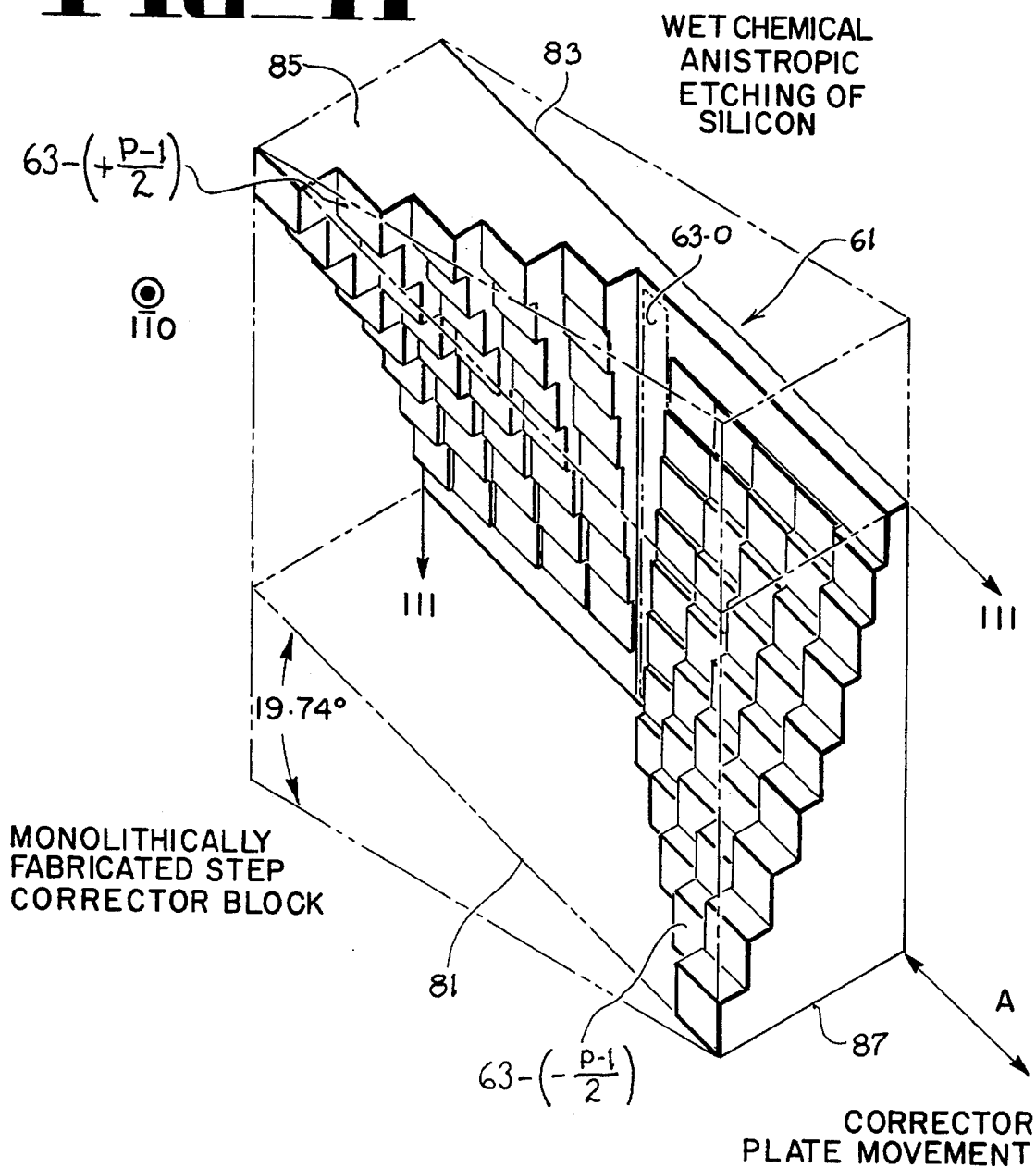

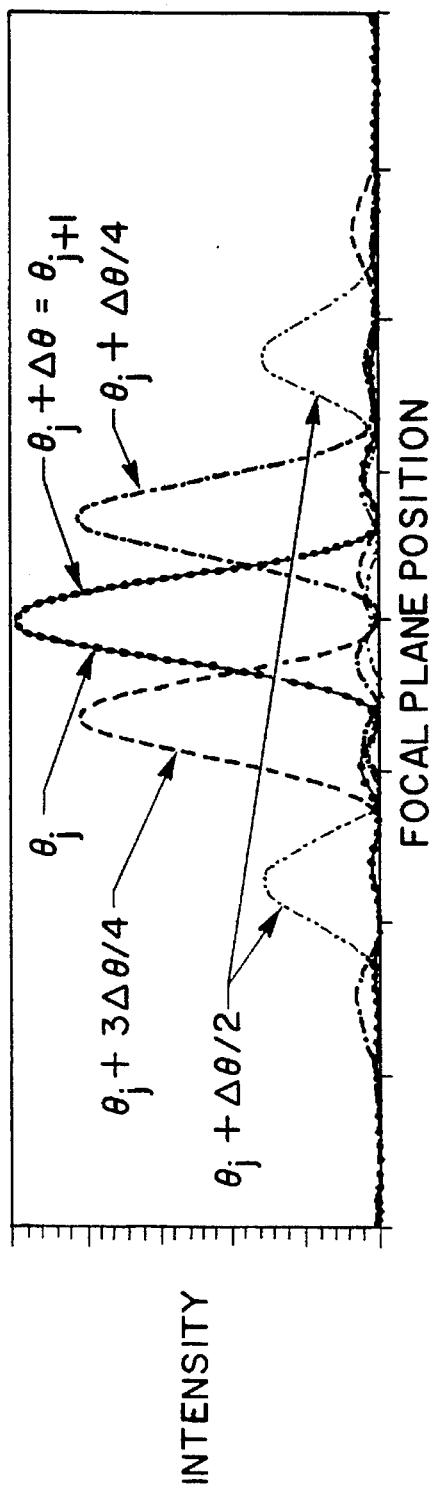

FIG_13
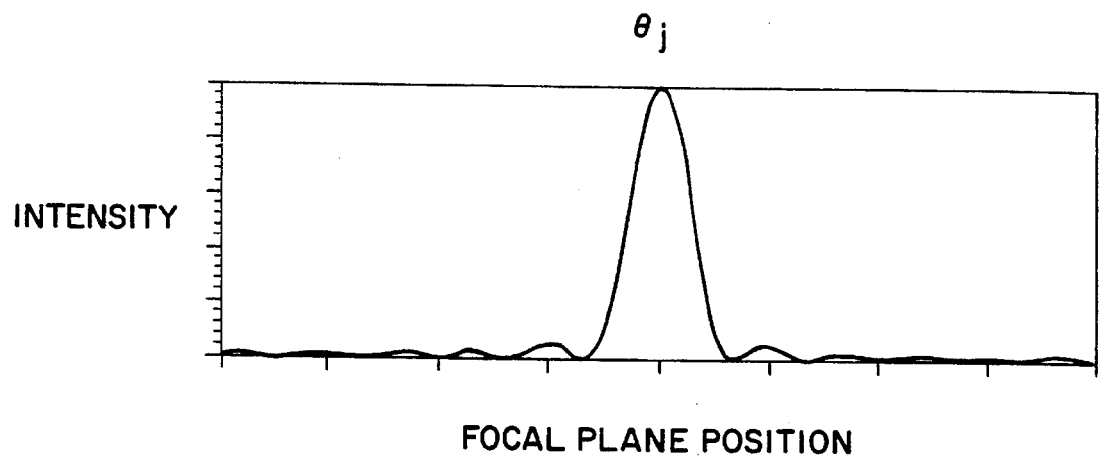
FIG_14
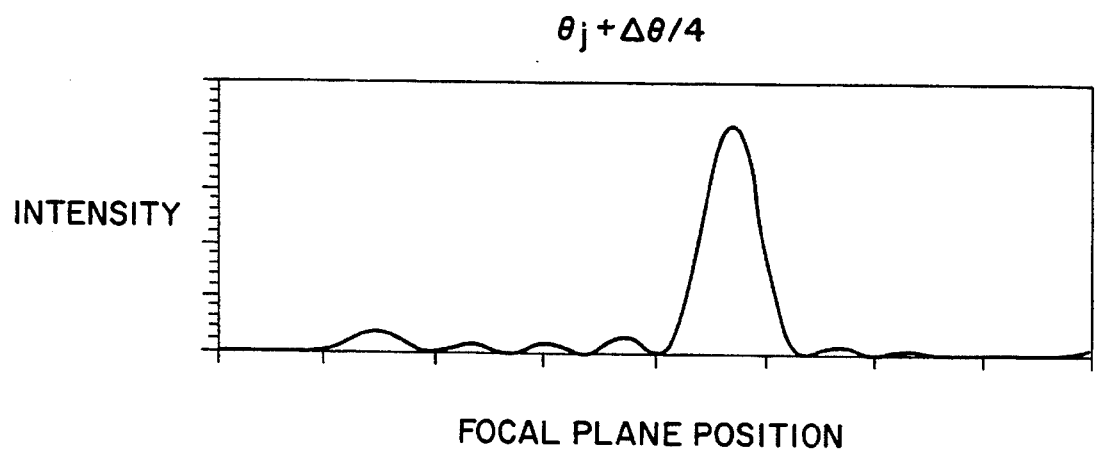
FIG_15
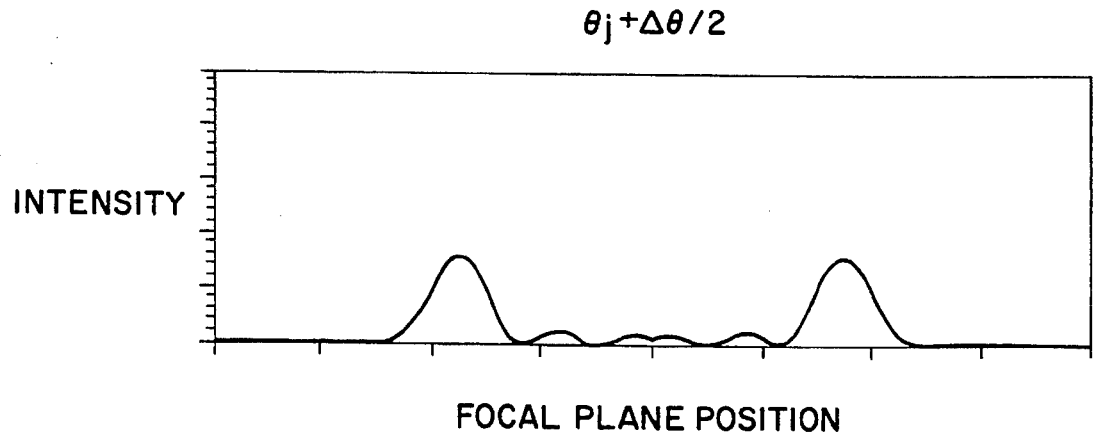

FIG_16
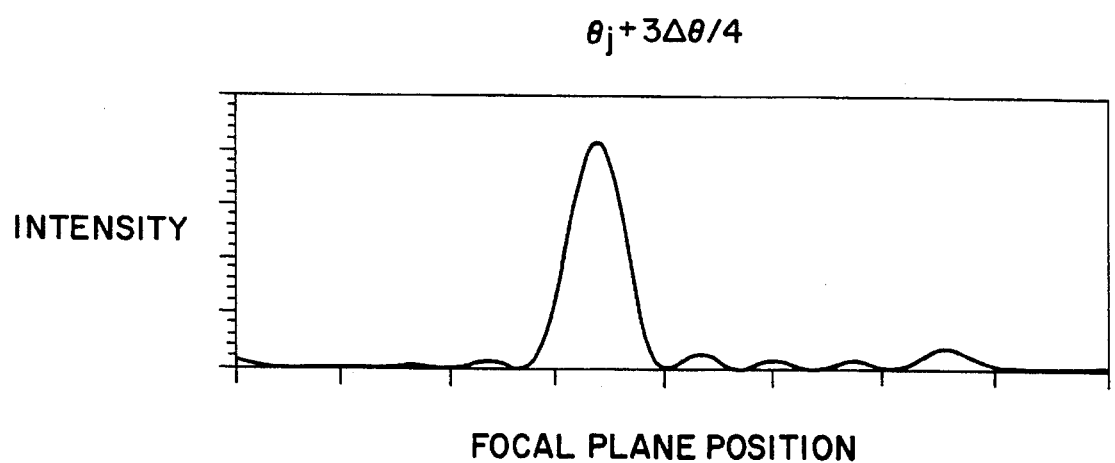
$\theta_j + 3\Delta\theta/4$
INTENSITY
FOCAL PLANE POSITION
FIG_17
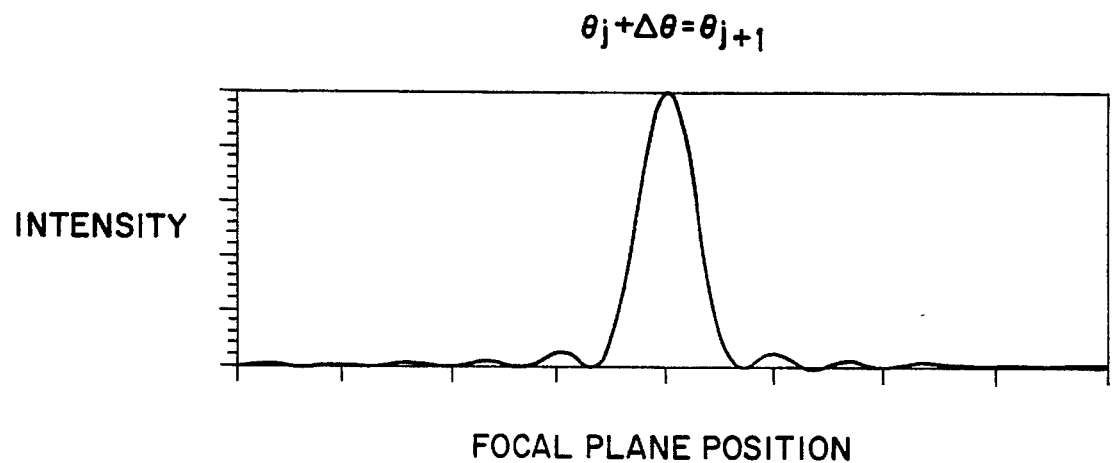
$\theta_j + \Delta\theta = \theta_{j+1}$
INTENSITY
FOCAL PLANE POSITION

FIG_18
POLYCHROMATIC
POINT SPREAD
FUNCTION FOR
1 μm BANDWIDTH
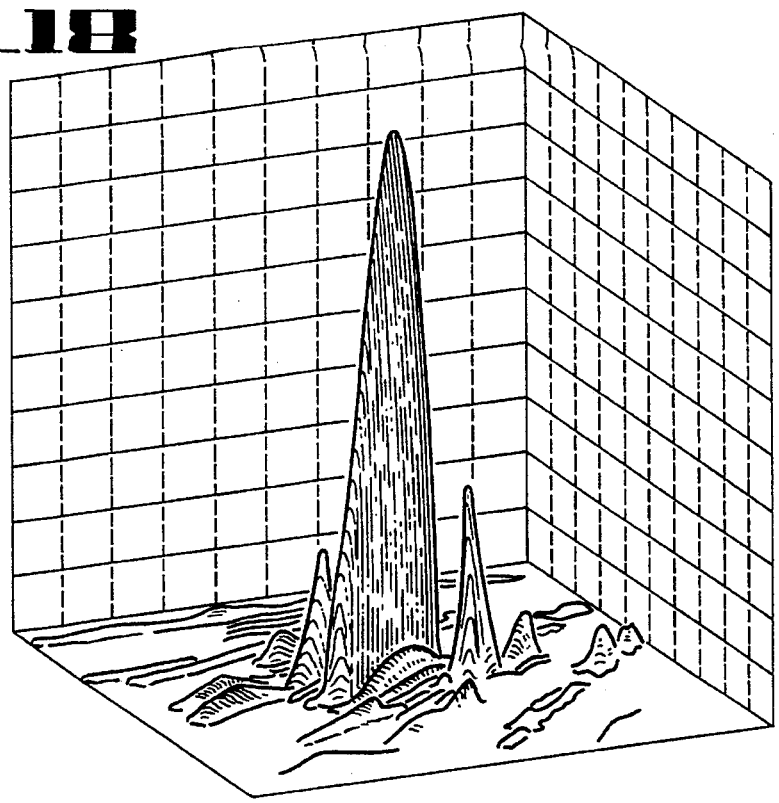
FIG_19
POLYCHROMATIC POINT SPREAD
FUNCTION WITH STEPPED
WAVEFRONT CORRECTION
SCAN ANGLE
POSITION AT
EIGEN ANGLE
FOR CENTER
WAVELENGTHS
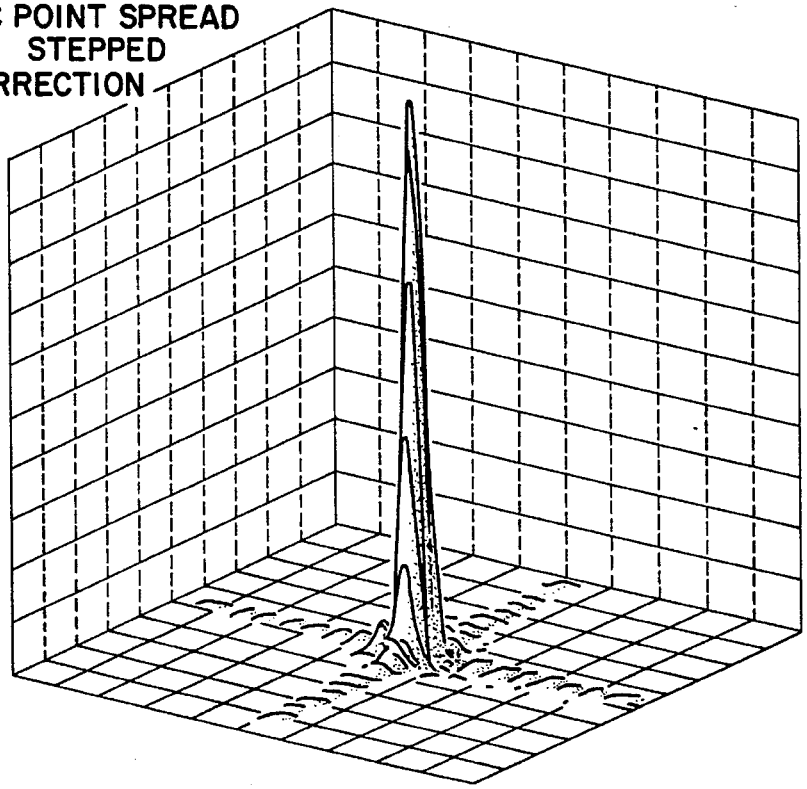

FIG_20
MICRO-MIRROR SCANNING
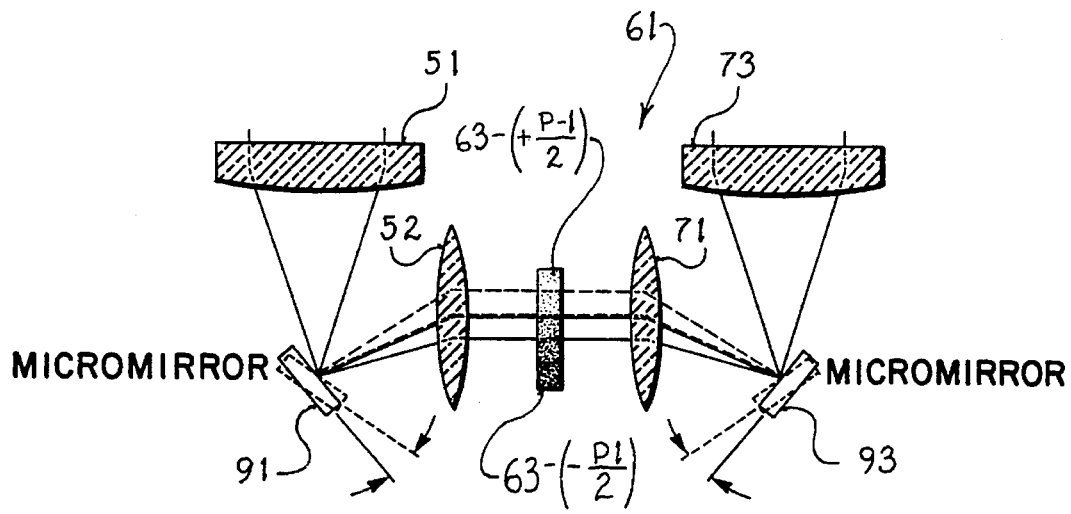
FIG_21
MICRO-AGILE BEAM STEERING
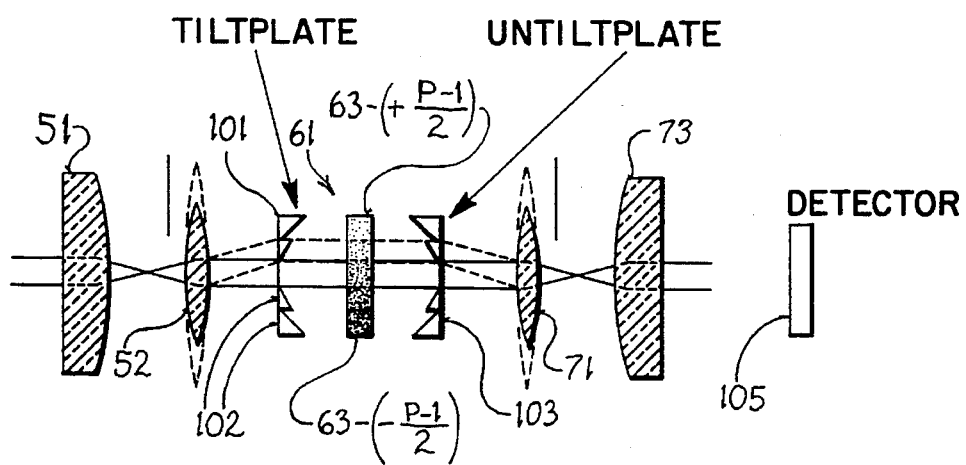

WAVEFRONT CORRECTOR FOR SCANNING MICROLENS ARRAYS

CROSS REFERENCES TO RELATED U.S. APPLICATIONS

This is a divisional of application Ser. No. 08/064,947 filed on May 20, 1993, now U.S. Pat. No. 5,444,572 which application is a continuation-in-part of U.S. patent application Ser. No. 08/011,323 filed Jan. 29, 1993 and entitled "Internally Cooled Large Aperture Microlens Array with Monolithically Integrated Microscanner", George Gal and Howard E. Morrow inventors, and assigned to the same assignee as the assignee of this application.

This application claims the benefit of the Jan. 29, 1993 filing date for the subject matter which is common to the parent application Ser. No. 08/011,323 filed Jan. 29, 1993.

The parent application Ser. No. 08/011,323 filed Jan. 29, 1993 was in turn a continuation-in-part of a pending application Ser. No. 07/982,514 filed Nov. 27, 1992, now U.S. Pat. No. 5,310,623, issued on May 10, 1994, and entitled "Method and Apparatus for Fabricating Microlenses" George Gal inventor, and assigned to the same assignee as the assignee of this application.

This application also claims the benefit of the Nov. 27, 1992 filing of the parent application Ser. No. 07/982,514 for the subject matter which is common to the parent application Ser. No. 07/982,514 filed Nov. 27, 1992.

The co-pending application Ser. No. 08/011,323 filed Jan. 29, 1993 and entitled "Internally Cooled Large Aperture Microlens Array with Monolithically Integrated Microscanner", George Gal and Howard E. Morrow inventors, is incorporated by reference in this application.

The application Ser. No. 07/982,514 filed Nov. 27, 1992 and entitled "Method and Apparatus for Fabricating Microlenses", George Gal inventor, is also incorporated by reference in this application.

BACKGROUND OF THE INVENTION

The prior application Ser. No. 08/011,323 filed Jan. 29, 1993 (referred to above) disclosed and discussed the stepped wavefront output which can be produced by certain angles of scan and by certain positions of scan in scanning microlens array apparatus. A stepped wavefront output at the outlet of the scanning microlens arrays can result from differences in the lengths of the optical paths that the segments of the incoming wavefront must travel in the air in front of the microlens arrays before the segments are transmitted through the individual unit cell trains in the microlens arrays.

Each unit cell train can be constructed to transmit, within the unit cell train, a segment of the incoming wavefront. Each segment transmitted within an individual unit cell train is polychromatically correct within the transmitted segment and also has a collimated output without any steps in that segment at the outlet of the individual unit cell train. Each unit cell train provides a collimated output through the exit pupil of the unit cell train without vignetting. These characteristics of each individual unit cell train are true for all angles of scan of an individual unit cell train. This is illustrated in FIGS. 12–16 of said application Ser. No. 08/011,323 and is discussed in the description relating to those figures of the drawings.

However, when the unit cell trains are mounted in rows and columns in rectangular arrays, and when the scanning array of microlenses is moved (in a direction aligned with the columns) to a scan position in which the angle of scan (theta, $\Theta$) is an angle inclined to the optical axis (when the incoming wavefront is viewed at an angle other than head on), the segment of the wavefront transmitted to each unit cell train in a column of unit cell trains will have an optical path length (in the air in front of the arrays) which is different from the optical path length of every other unit cell train in that column. The differences in the lengths of the optical paths in the air in front of the arrays produce steps in the wavefront at the output of the arrays. This occurs, even though (as noted above) each individual segment of the wavefront transmitted through each individual unit cell train in the column is transmitted through that individual unit cell train collimated and without any optical path length differences in that individual segment of the wavefront.

FIG. 22 of said application Ser. No. 08/011,323 illustrates this phenomenon.

As illustrated in FIG. 22 of said application Ser. No. 08/011,323, the entire wavefront as transmitted through the scanning microlens arrays does have steps in the wavefront at the outlet of the arrays.

FIG. 22 of said application Ser. No. 08/011,323 shows the steps which are present in the output wavefront when the scanning microlens array is positioned to produce a plus 20 degree angle of scan.

As described in said application Ser. No. 08/011,323, if the incoming light is monochromatic light and if the scanning microlens array is positioned at an Eigen angle location, then the steps in the mosaic wavefront (which steps result from the differences in the lengths of the optical paths of the segments of the wavefront in the air in front of the arrays) have a particular monochromatic diffraction point spread function response at the detector plane which produces a single high intensity peak for each pixel corresponding to each unit cell train. Satisfactory image resolution is possible and is obtained under these conditions. In this monochromatic light, Eigen angle scan location, mode of operation, the scan may be either in an X direction or in a Y direction, or the scan may be a two dimensional scan in both the X and Y directions.

Thus, if each position of scan of the scanning microlens array is an Eigen angle position for the particular wavelength of the monochromatic light transmitted through the scanning microlens array apparatus, the monochromatic diffraction point spread function point spread response in each pixel will be a high intensity, single peak as illustrated in FIG. 32 of said application Ser. No. 08/011,323; and satisfactory imaging at the detector plane is obtained.

However, for polychromatic light, wavefront correction of the stepped wavefront is needed in order to produce acceptable imaging for the polychromatic light. This is pointed out at page 34, lines 13–16 of said application Ser. No. 08/011,323.

The steps must be removed to obtain acceptable imaging for polychromatic light.

SUMMARY OF THE INVENTION

This application is directed to methods and apparatus which produce a wavefront correction needed for polychromatic light in order to obtain acceptable imaging at the detector plane.

This application is particularly directed to methods and apparatus for transferring a polychromatic image through scanning microlens arrays and into a sensor with near diffraction limited performance.

This application also provides wavefront correction which can be used with monochromatic light to enable at least some of the positions of scan to be positions which are not Eigen angle positions.

Wavefront correction apparatus constructed in accordance with the present invention for correcting a stepped wave output (which can be produced by certain angles of scan and by certain positions of scan in scanning microlens arrays) comprises at least one non-scanning array of microlenses and at least one scanning array of microlenses.

Microlenses in each array are aligned in rows and columns and are inter-associated between the arrays to form individual unit cell trains which are also aligned in said rows and columns.

The scanning array is moved to selected scan positions with respect to the non-scanning array.

In the method and apparatus of the present invention the scanning of the scanning array is limited to movement of the scanning array in one linear direction only. This direction is the direction of alignment of the columns of the microlenses in the arrays.

When the scanning is limited to scanning in the direction of the columns (so that there is no scanning in the direction of a row), each unit cell train in a particular row sees the same angle of scan. The length of the optical path of a segment of the incoming wavefront in the air in front of a unit cell train in a particular row is therefor the same as that every other unit cell train in that row, at any scan angle. But the length of that optical path (in the air in front of the arrays) for each of the unit cell trains in any one row is different from the lengths of the optical paths in air of the unit cell trains in all of the other rows (for all angles of scan other than a scan angle which is head on to the wavefront coming into the microlens arrays).

The length of the optical path of each segment internally within each unit cell train is, of course, equal to that of every other segment transmitted through the arrays, because the distance from the front inlet surface of each unit cell train to the back outlet surface of each unit cell train is the same.

The steps in the wavefront at the outlet of the arrays are therefor caused by the differences in the lengths of the optical paths of the segments of the wavefront in the air in front of the arrays.

In accordance with the present invention beam shaping optics form the outputs of all of the unit cell trains of the arrays into a unique, separate, linear image at each position of scan of the scanning array.

The linear image is aligned with the direction of scan (and therefor is also aligned with the columns of the microlenses) in the arrays.

A wavefront corrector is positioned in the path of the linear image for removing the steps in the wavefront which occur as the wavefront is transmitted through the arrays of microlenses at the positive and negative angles of scan.

The wavefront corrector is made of a material having an index of refraction different from air.

The material has, at each location corresponding to the location of a particular row of unit cell trains, a selected thickness. The selected thickness is effective to vary the time of optical passage through the material's thickness in an amount to compensate for any differences in the lengths of the in air optical paths (as described above) through the related unit cell trains in that row and the lengths of the in air optical paths through the unit cell trains in the other rows. This controlled variation (row by row) in time of optical passage through the material restores the wavefront to a continuous, unstepped form at the outlet of the material.

Each microlens has a diameter d; and, when the scan angle is e, the amount of the step in the wavefront between two immediately adjacent rows of unit cell trains at the output of the array is d sine $\Theta$.

The material has an index of refraction N, and the thickness of material required to remove the step in the wavefront between two immediately adjacent rows of unit cell trains is d/(N−1) multiplied by sine $\Theta$.

In a specific embodiment of the invention the material is silicon having an index of refraction greater than 3.0.

The beam shaping optics, in a specific embodiment of the present invention, includes cylindrical, demagnifying and collimating optics which produce an anamorphically compressed image at each position of scan of the scanning array.

The compressed image has a linear length substantially less than the length of a column of unit cell trains in the microlens array.

The wavefront corrector may be a block which comprises a plurality of stepped plate structures. Each stepped plate structure has a unique configuration which is specifically constructed to be associated with a related scan position of the scanning array.

The stepped plate structures can be fabricated as individual wafers and then connected together side by side in a block structure.

In a specific embodiment of the present invention the individual plate structures are monolithically fabricated in an integral crystal block structure. The steps are formed in the crystal block structure by binary photolithographically etching the steps in one face of the crystal. The etching follows the crystalline structure of the block so that all bottom and side surfaces on the etched face are substantially planer surfaces and all of the side surfaces are perpendicular to each related bottom surface.

Methods and apparatus which incorporate the features described above and which are effective to function as described above constitute specific objects of this invention.

Other and further objects of the present invention will be apparent from the following description and claims and are illustrated in the accompanying drawings, which by way of illustration, show preferred embodiments of the present invention and the principles thereof and what are now considered to be the best modes contemplated for applying these principles. Other embodiments of the invention embodying the same or equivalent principles may be used and structural changes may be made as desired by those skilled in the art without departing from the present invention and the purview of the appended claims.

BRIEF DESCRIPTION OF THE DRAWING VIEWS

FIG. 1 is a side elevation view of a scanning microlens array apparatus having a wavefront correction apparatus constructed in accordance with one embodiment of the present invention. The wavefront correction apparatus corrects and removes steps in a stepped wavefront output produced by certain angles of scan and by certain positions of scan of the scanning array of microlenses.

FIG. 2 is a plan view, taken along the line and in the direction indicated by the arrows 2—2 in FIG. 1.

FIG. 3 is an isometric, tutorial view illustrating principles of operation of the wavefront corrector apparatus of FIGS. 1 and 2.

FIG. 4 is a fragmentary enlarged view of the part of FIG. 3 shown encircled by the arrows 4—4 in FIG. 3.

FIG. 5 is an isometric view illustrating the Field of Regard (FOR) which can be scanned by a single unit cell train in the scanning microlens array apparatus shown in FIGS. 1 and 2 by scanning movement of the scanning array of microlenses between the maximum positive and negative angles of scan. The Field of Regard (FOR) is the scan capability of one detector plane pixel which is associated with the unit cell train. FIG. 5 also illustrates that the scanning array of microlenses can be scanned in only one linear direction (a vertical direction as illustrated in FIG. 5) in accordance with the present invention.

FIG. 6 is an isometric view of the scanning microlens arrays apparatus shown in FIGS. 1 and 2. In FIG. 6 certain components of the wavefront corrector apparatus (the components which are within the square defined by the dashed line) have been shown enlarged for clarity of illustration. In FIG. 6 the scan angle $\Theta$ is zero so that there are no steps in the wavefront transmitted through the arrays of microlenses; and no correction of the transmitted wavefront is required by the wavefront corrector apparatus.

FIG. 7 is a view like FIG. 6 but shows the scanning array of microlenses positioned at the maximum positive scan angle $\Theta$. In this case the stepped wavefront corrector block has been shifted in a cross scan direction (upwardly and to the left as viewed in FIG. 7) to locate an appropriate stepped plate of wavefront corrector material in the path of a linear image transmitted to the stepped wavefront corrector plate. This will be described in more detail below in the Detailed Description.

FIG. 8 is a view like FIGS. 6 and 7 but shows the scanning array of microlenses positioned at the maximum negative scan angle $\Theta$. In this case the stepped wavefront corrector block has been shifted in a cross scan direction (downwardly and to the right as viewed in FIG. 8) to position the appropriate stepped wavefront corrector plate material in the path of the linear image.

FIG. 9 is an isometric, exploded view showing how individual stepped corrector plates can be fabricated as separate wafers for subsequent assembly together to form a unitary stepped wavefront corrector block structure in accordance with one embodiment of the present invention.

FIG. 10 is an isometric view showing how the individual, stepped corrector plates of FIG. 9 can be fused together to form an integral stack or block of the individual, stepped wavefront corrector plates.

FIG. 11 is an isometric view showing how a single block can be skewed at the orientation of the crystalline structure and then fabricated, using binary, photolithographic masking and etching techniques, to form an integral corrector block having step surfaces at selected depths and at selected locations. The step surfaces have perfectly flat bottom and side wall surfaces which are perpendicularly aligned.

FIG. 12 is a diagram presenting a graphical representation of how the intensity of the image at the focal plane position is dependent upon the angle of scan $\Theta$. FIG. 12 shows, in the dashed lines, how the intensity drops off progressively as the angle of scan gets farther away from an Eigen angle position.

FIG. 13 is a view like FIG. 12 but shows only the single peak at high intensity when the angle of scan is an Eigen angle position.

FIG. 14 is a view like FIGS. 12 and 13 but shows only how the intensity of the peak is diminished at a scan angle which is a quarter of an Eigen angle position away from an Eigen angle position.

FIG. 15 is a view like FIGS. 12–14 but shows only how the intensity is diminished even more when the scan angle position is a half of an Eigen angle position away from an Eigen angle position.

FIG. 16 is a view like FIG. 14 but shows the diminished intensity at a location which is produced by a scan angle which is one quarter Eigen angle position away from the FIG. 13 Eigen angle position and three quarter Eigen angle position away from the next closest Eigen angle position.

FIG. 17 is a view like FIGS. 12–16 but shows how the intensity is returned to its maximum value at an Eigen angle position which is at a scan angle location exactly one integral Eigen angle scan position removed from the scan angle location shown in FIG. 13.

FIG. 18 is an isometric view showing the intensity for a polychromatic point spread function at the image plane for one micrometer bandwidth light without the stepped wavefront correction of the present invention.

FIG. 19 is a view like FIG. 18 but shows how the polychromatic point spread function is returned to a maximum single peak intensity using the stepped wavefront correction of the present invention. FIG. 19 shows the intensity for a scan angle position at an Eigen angle position for the center wavelengths of the polychromatic band.

FIG. 20 is a plan view, generally similar to FIG. 2, but showing another embodiment of the present invention in which micro-mirror scanning is used to direct the linear image formed at each position of scan to an appropriate stepped corrector plate. In FIG. 20 the block of stepped corrector plates is mounted in a fixed position, rather than being laterally movable as shown in the embodiments illustrated in FIGS. 2 and 6–8.

FIG. 21 is a view like FIG. 2 but showing another embodiment of the present invention in which agile beam steering is used to direct the linear image at a particular location of scan to the appropriate stepped wavefront corrector plate. In FIG. 21 the block of stepped wavefront collector plates is mounted in a fixed position, the cylindrical lenses are shifted laterally (as illustrated by the dashed outlines), and a tilt plate, having a number of prisms mounted in fixed positions, is used to align the path of the linear image with the orientation and location of an appropriately stepped wavefront corrector plate.

DETAILED DESCRIPTION OF THE PREFERRED EMBODIMENTS

This application is a continuation in part of U.S. patent application Ser. No. 08/011,323 filed Jan. 29, 1993 and entitled "Internally Cooled Large Aperture Microlens Array with Monolithically Integrated Microscanner", George Gal and Howard E. Morrow inventors, and assigned to the same assignee as the assignee of this application.

This application claims the benefit of the Jan. 29, 1993 filing date for the subject matter which is common to the parent application Ser. No. 08/011,323 filed Jan. 29, 1993.

The parent application Ser. No. 08/011,323 filed Jan. 29, 1993 was in turn a continuation-in-part of a pending application Ser. No. 07/982,514 filed Nov. 27, 1992 and entitled "Method and Apparatus for Fabricating Microlenses", George Gal inventor, and assigned to the same assignee as the assignee of this application.

This application also claims the benefit of the Nov. 27, 1992 filing of the parent application Ser. No. 07/982,514 for the subject matter which is common to the parent application Ser. No. 07/982,514 filed Nov. 27, 1992.

The co-pending application Ser. No. 08/011,323 filed Jan. 29, 1993 and entitled "Internally Cooled Large Aperture Microlens Array with Monolithically Integrated Microscanner", George Gal and Howard E. Morrow inventors, is incorporated by reference in this application.

The application Ser. No. 07/982,514 filed Nov. 27, 1992 and entitled "Method and Apparatus for Fabricating Microlenses", George Gal inventor, is also incorporated by reference in this application.

The prior application Ser. No. 08/011,323 filed Jan. 29, 1993 (referred to above) disclosed and discussed the stepped wavefront output which can be produced by certain angles of scan and by certain positions of scan in scanning microlens array apparatus. A stepped wavefront output at the outlet of the scanning microlens arrays can result from differences in the lengths of the optical paths that the segments of the incoming wavefront must travel in the air in front of the microlens arrays before the segments are transmitted through the individual unit cell trains in the microlens arrays.

Each unit cell train can be constructed to transmit, within the unit cell train, a segment of the incoming wavefront.. Each segment transmitted within an individual unit cell train is polychromatically correct within the transmitted segment and also has a collimated output without any steps in that segment at the outlet of the individual unit cell train. Each unit cell train provides a collimated output through the exit pupil of the unit cell train without vignetting. These characteristics of each individual unit cell train are true for all angles of scan of an individual unit cell train. This is illustrated in FIGS. 12–16 of said application Ser. No. 08/011,323 and is discussed in the description relating to those figures of the drawings.

However, when the unit cell trains are mounted in rows and columns in rectangular arrays, and when the scanning array of microlenses is moved (in a direction aligned with the columns) to a scan position in which the angle of scan (theta, $\Theta$) is an angle inclined to the optical axis (when the incoming wavefront is viewed at an angle other than head on), the segment of the wavefront transmitted to each unit cell train in a column of unit cell trains will have an optical path length (in the air in front of the arrays) which is different from the optical path length of every other unit cell train in that column. The differences in the lengths of the optical paths in the air in front of the arrays produce steps in the wavefront at the output of the arrays. This occurs, even though (as noted above) each individual segment of the wavefront transmitted through each individual unit cell train in the column is transmitted through that individual unit cell train collimated and without any optical path length differences in that individual segment of the wavefront.

FIG. 22 of said application Ser. No. 08/011,323 illustrates this phenomenon.

As illustrated in FIG. 22 of said application Ser. No. 08/011,323, the entire wavefront as transmitted through the scanning microlens arrays does have steps in the wavefront at the outlet of the arrays.

FIG. 22 of said application Ser. No. 08/011,323 shows the steps which are present in the output wavefront when the scanning microlens array is positioned to produce a plus 20 degree angle of scan.

As described in said application Ser. No. 08/011,323, if the incoming light is monochromatic light and if the scanning microlens array is positioned at an Eigen angle location, then the steps in the mosaic wavefront (which steps result from the differences in the lengths of the optical paths of the segments of the wavefront in the air in front of the arrays) have a particular monochromatic diffraction point spread function response at the detector plane which produces a single high intensity peak for each pixel corresponding to each unit cell train. Satisfactory image resolution is possible and is obtained under these conditions, In this monochromatic light, Eigen angle scan location, mode of operation, the scan may be either in an X direction or in a Y direction, or the scan may be a two dimensional scan in both the X and Y directions.

Thus, if each position of scan of the scanning microlens array is an Eigen angle position for the particular wavelength of the monochromatic light transmitted through the scanning microlens array apparatus, the monochromatic diffraction point spread function point spread response in each pixel will be a high intensity, single peak as illustrated in FIG. 32 of said application Ser. No. 08/011,323; and satisfactory imaging at the detector plane is obtained.

However, for polychromatic light, wavefront correction of the stepped wavefront is needed in order to produce acceptable imaging for the polychromatic light. This is pointed out at page 34, lines 13–16 of said application Ser. No. 08/011,323.

The steps must be removed to obtain acceptable imaging for polychromatic light.

This application is directed to methods and apparatus which produce a wavefront correction needed for polychromatic light in order to obtain acceptable imaging at the detector plane.

This application is particularly directed to methods and apparatus for transferring a polychromatic image through scanning microlens arrays and into a sensor with near diffraction limited performance.

In FIGS. 1 and 2 a scanning microlens array apparatus constructed in accordance with one embodiment of the present invention is indicated generally by the reference numeral 31.

The scanning microlens array apparatus includes a microlens array assembly 33 and transfer optics 35 for transferring the output of the array assembly 33 to detectors in an image plane. See the image and detector plane 105 shown in FIG. 21.

The transfer optics 35 are anamorphic transfer optics with diffractive corrections, as will be described in more detail below.

The scanning microlens arrays 33 may comprise two or more arrays of microlenses with at least one of the arrays being a scanning array.

The embodiment illustrated in FIGS. 1 and 2 shows two arrays of microlenses.

The first array 37 is fixed in position and is a wide field static imager array.

The second array 39 is a collimating scanner array which is moveable to certain selected scan positions (by apparatus not shown in the drawings).

Each array has microlenses aligned in rows and columns. The microlenses in the wide field static imager array 37 and in the collimating scanner array 39 are inter-associated between the arrays to form individual unit cell trains which are also aligned in the rows and columns.

The unit cell trains are minus 1 magnification unit cell trains in the embodiment illustrated in FIGS. 1 and 2, but one or more additional arrays of microlenses can be incorporated to provide plus one magnification unit cell trains, if desired.

Various embodiments of minus 1 and plus 1 magnification unit cell trains are disclosed and described in said application Ser. No. 08/011,323.

In the embodiment of the invention illustrated in FIGS. 1 and 2 there are nine individual unit cell trains in each vertical column (see FIG. 1) and there are eleven individual unit cell trains in each row (see FIG. 2).

The collimating scanner array 39 is scanned in one direction only in accordance with the present invention.

The direction of scan is aligned with the direction of the columns of microlenses. The direction of scan is in the vertical direction (as viewed in FIG. 1) and is indicated by the block arrow X.

The angular extent of the scan (for example, a scan between +20 degrees and −20 degrees for a total of 40 degrees or a scan between +10 degrees and −10 degrees for a total of 20 degrees) and the resolution to be produced throughout the extent of the scan are, in general, design requirements. Unit cell trains, each having 4 degree by 4 degree Field of View (FOV) as described at page 25, lines 4–8 of said application Ser. No. 08/011,323 referred to above, may be moved to scan positions which are just slightly less than 4 degrees apart; or such unit cell trains may be moved to scan positions which are spaced closer together (provided that the scan positions are Eigen angle positions for polychromatic light as described in more detail below) to produce more lines of scan and possibly to produce higher resolution. Unit cell trains having other Fields of View (FOV), such as, for example, 3 degrees by 3 degrees may be used with appropriate scan positions.

The chromatic and thermal performance of a unit cell train is material dependent. The chromatic and thermal performance of unit cell trains made of silicon is excellent.

There is no movement of the collimating scanner array 39 in any other direction than the X direction. Thus, in the cross scan direction (the Y direction indicated by the block arrow Y in FIG. 2), there is no scanning movement. The cross scan direction is aligned with the rows of microlenses in the rectangular arrays.

In FIG. 1 the collimating scanner array is positioned to produce a plus 20 degree angle of scan. The unit cell trains in the array assembly 33 are thus looking upwardly at a 20 degree angle from the optical axis.

The angle of scan is indicated by Θ in FIG. 1.

The incoming wavefront is indicated by the legend WF in FIG. 1.

This incoming wavefront WF is inclined (with respect to the vertical front surfaces of the microlenses in the wide field static imager 37) at the angle Θ.

The segment of the incoming wavefront WF which each individual unit cell train sees is indicated by the letter d in FIG. 1. The dimension of d is the diameter or width of a microlens.

Typically, the diameter or width d of the microlens would be about one millimeter.

FIG. 1 shows, by the dashed lines in the upper parts of the microlens arrays, how the segment of the incoming wavefront is transmitted through the unit cell train formed by a microlens 41 in one upper corner of the array 37 and by an associated microlens 43 in an associated corner location of the microlens array 39.

Each segment of the incoming wavefront WF has a total optical path length between the incoming wavefront WF and the outgoing wavefront WF-OUT which is the sum of (1) the length of the path in the air from the incoming wavefront WF to the inlet of the related unit train, (2) the length of the path within the unit cell train, and (3) the length of the path in the air from the outlet of the unit cell train to the outgoing wavefront WF-OUT.

The total optical path length of each segment is the same for all of the segments.

The length of the path within each unit cell train (from the inlet to the outlet of the unit cell train) is the same.

So the segments which have longer in air path lengths in front of the unit cell trains have shorter in air path lengths behind (at the outlet) of the unit cell trains.

Each individual segment exits its unit cell train collimated and without any steps within that segment of the wavefront.

The outgoing wavefront WF-OUT as shown in FIG. 1 therefor has steps in the wavefront as illustrated.

The in air path length differences (at the front of the arrays) between the different rows result from the inclination of the incoming wavefront WF with respect to the front surface of the array 37.

Thus, in the plus 20 degree angle of scan illustrated in FIG. 1, the shortest in air path length is the length of the in air path from the segments of the incoming wavefront WF to the front surfaces of the uppermost row of unit cell trains. The length of this in air path is essentially zero for the wavefront WF illustrated.

The longest in air path length (at the front of the arrays) is in the in air path length of the lowermost row.

The longest in air path in front of the arrays yields the shortest air path after the arrays, because the material path is always the same through the unit cells.

The difference in the lengths of the optical air paths of the segments between any two adjacent rows of unit cell trains in the outgoing wavefront at any angle of scan is substantially d sine Θ. This difference is indicated by the legend "d sine Θ" on the indicated step in the outgoing wavefront WF-OUT in FIG. 1.

Since the in air optical path length (in front of the arrays and in the vertical direction of the wavefront) is shorter for the unit cell trains in the upper row than the in air optical path lengths for the unit cell trains in the lower rows, each segment of the incoming wavefront WF transmitted through a unit cell train in the upper row leaves the outlet side of the array 39 sooner than the segments transmitted through the unit cell trains in the lower rows; and this results in steps in the outgoing wavefront WF-OUT, as illustrated in FIG. 1.

FIG. 2 shows, in the dashed lines within the unit cell train formed by the microlenses 45 and 47 at the top of the arrays in FIG. 2, how a segment of light is transmitted through each individual unit cell train in a row of cell trains. Because there is no scanning movement in the cross scan direction, the incoming wavefront is always received head on in the cross scan direction. There are no steps in the output of the wavefront in the cross scan direction, in any of the rows.

Thus, as the incoming wavefront is transmitted through the scanning microlens apparatus 31 in the Z direction (the direction indicated by the block arrow Z in FIGS. 1 and 2), the only steps in the transmitted wavefront are the steps appearing in the vertical, scan direction.

These steps in the vertical, scan direction are the steps which need to be corrected in order to obtain satisfactory imaging response for polychromatic light.

The present invention takes advantage of the fact that the outgoing wavefront has steps only in the vertical orientation (as viewed in FIG. 1) and has no steps which require correction in the horizontal orientation (as viewed in FIG. 2).

The anamorphic transfer optics 35 include beam shaping optics (a cylindrical lens 51 and a collimating lens 53) which form the outputs of all of the unit cell trains of the arrays 37 and 39 into a unique, separate, linear image at each position of scan of the scanning array 39.

This linear image is indicated by the reference numeral 55 in FIG. 2, (and FIGS. 3 and 4); and the linear image is aligned with the direction of the columns of the microlenses (is vertically aligned as viewed in FIG. 1).

Forming the output of the scanning microlens arrays 33 to a linear image is an important feature of the present invention. The linear image permits a relatively narrow plate of material to be positioned in the path of the linear image for removing the steps in the wavefront. The material in the plate is a material which has an index of refraction different from the index of refraction of air so that the wavefront travels through the material at a speed which is different from the speed of travel of the stepped wavefront in air.

The plate of material can therefore have a selected thickness at each location on the plate corresponding to the location of a particular row of unit cell trains in the linear image, and the selected thickness will be effective to vary the time of optical passage through the material in a way to restore the wavefront to a continuous, unstepped form at the outlet of the plate of material.

In accordance with the present invention, and as illustrated in FIGS. 1 and 2, a stepped wavefront corrector block 61 is positioned at the outlet of the collimating lens 52.

In a specific embodiment of the present invention the stepped wavefront corrector block 61 is made of silicon which has an index of refraction approximately three times greater than the index of refraction of air.

As shown in FIG. 2, the stepped wavefront corrector block 61 comprises vertically extending plates 63

$$\left( \text{ plates } 63 - \left( +\frac{P-1}{2} \right) \text{ through } 63 - \right.$$

$$\left. \left( -\frac{P-1}{2} \right) - \text{see FIG. 2} \right)$$

with each plate 63 corresponding to one particular scanning location of the collimating scanner array 39.

The number P is a design number related to the Field of Regard (FOR) and the Field of View of the unit cell trains to insure a continuous coverage within the FOR. For example, if there is a requirement for a 40 degree FOR and if the unit cell trains have a FOV of 4 degrees by 4 degrees, a minimum of eleven scan positions would be required to insure some overlap for continuous coverage. Dividing 40 by 4 gives ten positions exactly but would not insure some overlap. P is selected as an even odd integer which is always one more integer than absolutely needed. As noted above more scan positions can be added to provide finer resolution of the images. All scan positions must be Eigen Angle positions for polychromatic light.

The number of plates 63 needed is therefor determined by the number P.

One plate 63, the center plate 63-0 of the block, is the plate for Θ equals zero, as illustrated in FIGS. 2 and 6–11.

The silicon material slows down the segment of the wavefront as it travels through the material. The thickness of the material can be selected at each location (corresponding to the location of a particular row of the unit cell trains in the linear image) to slow down the time of optical passage through the material thickness in an amount to compensate for the size of the steps in the output wavefront WF-OUT. The selected thicknesses of the material thereby restore the wavefront to a continuous, unstepped form at the outlet of said material.

With the plus 20 degree angle of scan Θ illustrated in FIG. 1, the segments of the wavefront transmitted through the uppermost unit cell trains need to be slowed down the most.

In the specific embodiment shown in FIGS. 1 and 2, the lens 51 and 52 invert the wavefront image as the wavefront is transmitted through those two lenses, so the wavefront segment at the lowermost part of the linear image at the outlet of the collimating lens 52 needs to be slowed down the most.

The plate $$63 - \left( -\frac{P-1}{2} \right)$$

(the plate positioned to receive the linear image 55 produced at the plus 20 degree angle of scan) therefor has the greatest thickness of material at the lowermost part of this plate, as illustrated in FIG. 1. The front side of this plate, as viewed in FIG. 1, is formed with steps. As you proceed from the bottom to the top of this plate shown in FIG. 1, the steps have less thickness at each plate location corresponding to a particular row of microlenses in the linear image.

In the embodiment shown in FIGS. 1 and 2 the block 61 is shifted laterally, in the direction indicated by the block arrows A in FIG. 2, to position the proper plate 63 in line with the unique linear image produced at a particular location of scan of the collimating scanner array 39.

For example, at the zero degree angle of scan (see FIG. 6), the plate 63-0 is positioned in alignment with the linear image. This plate 63-0 has no steps in the front surface, because there are no steps in the output wavefront WF-OUT at the zero degree angle of scan.

In accordance with the present invention the lenses 51 and 52 preferably form a demagnifying lens set so that the height of the linear image 55 will be substantially less than the height of a column of microlenses in the arrays 37 and 39. The ratio of demagnification is dependent upon the ratio of the diameters D1 and D2 of the respective lenses 51 and 52. A demagnification of about 10 to 1 has been found to be a good ratio. This 10 to 1 demagnification, for example, permits the height of each plate 63 to be reduced to one tenth the height of the microlens arrays.

The demagnificating lens set can be a minus lens set (as shown) or a positive lens set. If a positive lens set is used, the corresponding stepped wavefront corrector plate 63 would be inverted from that shown.

The depth of each step in the front surface of each plate 63 is dependent upon the index of refraction of the material of the plate and is determined by the expression d/(N−1) multiplied by sine Θ, where d is the diameter or width of a microlens, N is the index of refraction of the material of the plate 63, and Θ is the angle of scan, as described above.

It can be seen from this formula that materials having higher indexes of refraction permit smaller size steps to be utilized in the face of the material of the block 61.

As noted above, the step in the wavefront between two immediately adjacent rows of unit cell trains at the output of the arrays is d sine Θ. The thickness of the material in a plate 63 required to remove that step is d/(N−1) multiplied by sine Θ. This formula is illustrated as applied to a single step thickness in FIG. 1 of the drawings.

The stepped wavefront corrector block 61 of the present invention can thus be constructed to correct and to remove steps in the wavefront transmitted through the microlens arrays and to restore the wavefront to a continuous, unstepped form at the outlet of the stepped wave corrector block 61.

As will be described in more detail below with reference to FIGS. 12–19, satisfactory imaging at the detector plane can be obtained for polychromatic light of one micrometer bandwidth using the stepped wavefront corrector apparatus shown in FIGS. 1 and 2, when each scan position is an Eigen angle position for the center wavelengths of the bandwidth.

The stepped wavefront corrector apparatus can also be used for monochromatic light to enable at least some of the scan positions to be other than Eigen angle positions for the particular wavelength of the monochromatic light.

The anamorphic transfer optics 35 shown in FIG. 1 included a second set of beam shaping optics (a collimating lens 71 and a cylindrical lens 73) for converting the linear image (having the restored wavefront transmitted from the outlet of the wavefront corrector block 61) back to a two dimensional image. The two dimensional image corresponds to the two dimensional format image transmitted through the microlens arrays. The two dimensional image can be transmitted to a two dimensional array of detector pixels in the image plane (see the detector plane 105 shown in FIG. 21).

The lens 71 and 73 may be a magnifying lens set, if desired.

The structure and mode of operation described above with reference to FIGS. 2 and 3 can perhaps be better visualized by referring to FIG. 3.

FIG. 3 is an isometric, tutorial view.

In FIG. 3 the rows have been illustrated by the repetitive letters A,A, etc.; B,B, etc.; C,C, etc.; and the columns have been represented by the combinations of the single letters A,B,C,D, etc.

The scan direction X is in the direction of the columns, and the cross scan direction is aligned with the rows.

The path of travel of the wavefront is indicated by the letter Z.

FIG. 3 illustrates how the anamorphic transfer optics 35 first form the outputs of all of the unit cell trains into a linear, vertically aligned, inverted image 55 at the input side of the related stepped wavefront corrector plate 63.

The enlarged view of FIG. 4 shows that the image is always a linear image, no matter how tight and small the focus.

FIG. 5 is an isometric view showing how, as the scanning array 39 is moved to the various positions of scan between the maximum +Θ angle of scan and the minimum −Θ angle of scan, a single unit cell train scans a Field of Regard (FOR).

This Field of Regard (FOR) is the scan capability of one pixel associated with that unit cell train and located in the image plane.

The Field of View (FOV) for one particular position of scan is indicated by the circular area shown in FIG. 5, and the instantaneous Field of Resolution of that Field of View (FOV) is shown by the smaller circle in FIG. 5.

FIG. 6 is an isometric view of the scanning microlens arrays apparatus 31 shown in FIG. 1 and 2.

In FIG. 6 certain components of the wavefront corrector apparatus (the components which are within the square defined by the dashed lines) have been shown enlarged for clarity of illustration.

In FIG. 6 the scan angle Θ is zero, so there are no steps in the wavefront transmitted through the arrays 37 and 39. No correction of the transmitted wavefront is therefore required by the wavefront corrector apparatus, and the plate 63-0 is formed without any steps in the plate.

FIG. 7 is a view like FIG. 6 but shows the scanning array 39 positioned at the maximum positive scan angle Θ (plus 20 degrees in one specific embodiment of the present invention).

As illustrated in FIG. 7, the plate is positioned in line with the linear image for this plus 20 degree look up angle of scan. This positioning of the plate $$63 - \left( -\frac{P-1}{2} \right)$$

is also illustrated in FIG. 2 and is described above in reference to FIGS. 1 and 2 of the drawings for this particular plus 20 degree angle of scan.

FIG. 8 is a view. like FIGS. 6 and 7, but shows the scanning array of microlenses positioned at the maximum negative scan angle Θ (minus 20 degrees in one specific embodiment of the present invention).

In this case the stepped wavefront corrector block 61 has been shifted in a cross scan direction (downwardly and to the right as viewed in FIG. 8) to position the appropriate stepped wavefront collector plate $$63 - \left( -\frac{P-1}{2} \right)$$

in the path of the linear image.

The fabrication of the stepped wavefront corrector block 61 can be done in several ways.

FIG. 9 is an isometric, exploded view showing how individual stepped corrector plates 63 can be fabricated as separate wafers (for subsequent assembly together to form a unitary stepped wavefront corrector block-structure 61) in accordance with one embodiment of the present invention.

FIG. 10 is an isometric view showing how the individual, stepped corrector plates 63 of FIG. 9 can be fused together to form an integral stack or block 61 of the individual, stepped wavefront corrector plates 63.

FIG. 11 is an isometric view showing how a single block can be skewed at the orientation of the crystalline structure and then fabricated, using binary, photolithographic mask and etching techniques, to form an integral corrector block 61 having step surfaces at selected depths and at selected locations.

In accordance with a specific embodiment of the present invention, a silicon block (having the specific crystalline characteristics noted in FIG. 11) is formed with respective front, back, top and bottom surfaces 81, 83, 85 and 87 which are skew aligned with the crystalline orientation of the crystal.

The steps in the corrector plates 63 are then formed in the front surface 81 of the resulting block 61 by binary photolithographic masking and etching techniques.

Because the resulting block 61 has been skew aligned with the crystalline structure, the binary masking and etching fabrication technique can be used to form steps (having selected depths at selected orthogonally determined locations) with flat, perpendicular bottom and wall surfaces at each step as illustrated in FIG. 11.

Because the etching follows the crystalline structure of the silicon, consistent etching results can be obtainable and the perfectly perpendicular bottom and side surfaces and the precisely located depth for each step surface can be produced.

FIGS. 12–19 illustrate (and are helpful to an understanding of) the optical principles involved in the stepped wavefront corrector apparatus of the present invention.

These figures illustrate how, when polychromatic light of a certain bandwidth is transmitted through the scanning microlens array apparatus, the polychromatic point spread function can be maintained within a single peak of high intensity for satisfactory imaging when the scan positions are limited to scan positions at Eigen angle positions for the center wavelengths of the bandwidth.

FIG. 12 is a diagram presenting a graphical representation of how the intensity of the image at the focal plane position is dependent upon the angle of scan $\Theta$. FIG. 12 shows, in the dashed lines, how the intensity drops off progressively as the angle of scan gets farther away from an Eigen angle position.

FIG. 13 is a view like FIG. 12 but shows only the single peak at high intensity when the angle of scan is an Eigen angle position at $\Theta_j$ ($\Theta$=zero). This is the angle of scan which utilizes plate 63-0 of the block 61.

FIG. 14 is a view like FIGS. 12 and 13 but shows only how the intensity of the peak is diminished at a scan angle which is a quarter of an Eigen angle position away from an Eigen angle position.

FIG. 15 is a view like FIGS. 12–14 but shows only how the intensity is diminished even more when the scan angle position is a half of an Eigen angle position away from an Eigen angle position.

FIG. 16 is a view like FIG. 14 but shows the diminished intensity at a location which is produced by a scan angle which is one quarter Eigen angle position away from the FIG. 13 Eigen angle position and three quarter Eigen angle position away from the next closest Eigen angle position.

FIG. 17 is a view like FIGS. 12–16 but shows how the intensity is returned to its maximum value at an Eigen angle position which is at a scan angle location exactly one integral Eigen angle scan position removed from the scan angle location shown in FIG. 13.

FIG. 18 is an isometric view showing the intensity for a polychromatic point spread function at the image plane for one micrometer bandwidth light without the stepped wavefront correction of the present invention.

FIG. 19 is a view like FIG. 18 but shows how the polychromatic point spread function is returned to a maximum single peak intensity using the stepped wavefront correction of the present invention. FIG. 19 shows the intensity for a scan angle position at an Eigen angle position for the center wavelengths of the polychromatic band.

In the FIGS. 1 and 2 embodiments of the present invention the stepped wavefront corrector block 61 was physically shifted in the direction of the arrow A to position an appropriate stepped wavefront corrector plate 63 in the path of the linear image at each related position of scan of the scanning array 39.

FIGS. 20 and 21 show two other embodiments of the present invention in which the stepped wavefront corrector block 61 is not shifted, but instead is mounted in a fixed position.

In FIG. 20 (which is a plan view like FIG. 2) micro-mirror scanning is used to direct the unique linear image formed at each position of scan to an appropriate stepped corrector plate 63.

In FIGS. 20 and 21 components which correspond to components in FIGS. 1 and 2 are indicated by the same reference numerals.

In the FIG. 20 embodiment a first, scanning micro-mirror 91 is moved in synchronism with the movement of the scanning microlens array 43 to reflect each unique, separate linear image produced at each scan position onto the proper stepped plate structure 63 for that particular scan position.

A second scanning micro-mirror 93 is also scanned at the outlet of the stepped wavefront corrector block 61 and in synchronism with the first scanning micro-mirror 91.

In the FIG. 21 embodiment agile beam steering is used for directing each unique, separate linear image onto the proper stepped plate 63 at each of the selected scan positions.

In the FIG. 21 embodiment the collimating lenses 53 are scanned in synchronism with the movement of the scanning microlens array 39 (as indicated by the dashed lines in FIG. 21).

The agile beam steering in FIG. 21 includes a tilt plate 101 comprising a plurality of individual prisms 102 mounted at fixed positions.

The embodiment shown in FIG. 21 includes an untilt plate 103 and a scanning beam shaping lens 71, as illustrated.

The image and detector plane is indicated by the reference numeral 105 in FIG. 21.

While we have illustrated and described the preferred embodiments of our invention, it is to be understood that these are capable of variation and modification, and we therefore do not wish to be limited to the precise details set forth, but desire to avail ourselves of such changes and alterations as fall within the purview of the following claims.

We claim:

1. A method of correcting and removing steps in a stepped wavefront output produced by certain angles of scan and by certain positions of scan in unit cell trains of scanning microlens arrays having the unit cell trains arranged in rows and columns in the arrays, said method comprising, scanning one array of microlenses in one direction only, said one direction corresponding to the direction of alignment of the columns of the microlenses in the arrays, forming from outputs of all of the unit cell trains in the arrays a unique, separate, linear image at each position of scan of the scanning arrays, said linear images extending in said one direction, placing, in the path of each unique, separate, linear image a unique, stepped, wavefront corrector plate, each unique, stepped wavefront corrector plate being constructed of a material having an index of refraction different from air, said each unique, stepped, wavefront corrector plate having a specific step for a particular row of the unit cell trains, each step in said each unique, stepped, wavefront corrector plate having a selected thickness effective to vary the time of optical passage through the material thickness in an amount to restore the wavefront to a continuous, unstepped form at an outlet of said material.

2. A method of correcting a stepped wavefront output, produced by certain angles of scan and by certain positions of scan of unit cell trains in scanning microlens arrays, and reforming the stepped wavefront to a continuous, aligned wavefront, said method comprising, scanning one array of microlenses in one linear direction only, forming from outputs of all of the unit cell trains in the arrays and at each position of scan a unique separate, linear image, which image is aligned with the one linear direction, and interposing, in the path of each unique, separate, linear image, a related unique, stepped, wavefront corrector plate of material which removes any and all steps in a wavefront image entering the plate and which transmits a continuous, aligned wavefront image without steps at an outlet of the plate, each unique, stepped, wavefront corrector plate being constructed of a material having an index of refraction different from air, said each unique, stepped, wavefront corrector plate having a particular step for a particular, cross scan extending, row of the unit cell trains, each step having a particular thickness so that the particular thicknesses of the steps in said each unique, stepped wavefront corrector plate are effective to vary the time of optical passage through the material in amounts which restore the wavefront to a continuous, unstepped form at the outlet of the plate at each position of scan.

* * * * *